(12) United States Patent
Ching et al.

(10) Patent No.: US 10,361,126 B2
(45) Date of Patent: Jul. 23, 2019

(54) SYSTEM AND METHOD FOR WIDENING FIN WIDTHS FOR SMALL PITCH FINFET DEVICES

(71) Applicant: Taiwan Semiconductor Manufacturing Co., Ltd., Hsin-Chu (TW)

(72) Inventors: Kuo-Cheng Ching, Hsinchu County (TW); Shi Ning Ju, Hsinchu County (TW); Chih-Hao Wang, Hsinchu County (TW); Ying-Keung Leung, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/987,009

(22) Filed: May 23, 2018

(65) Prior Publication Data

US 2018/0269109 A1 Sep. 20, 2018

Related U.S. Application Data

(62) Division of application No. 15/261,302, filed on Sep. 9, 2016, now Pat. No. 10,008,414.

(Continued)

(51) Int. Cl.
*H01L 21/02* (2006.01)
*H01L 29/66* (2006.01)

(Continued)

(52) U.S. Cl.
CPC .. *H01L 21/823431* (2013.01); *H01L 21/0214* (2013.01); *H01L 21/02164* (2013.01);
(Continued)

(58) Field of Classification Search
CPC ..... H01L 21/823807; H01L 21/823821; H01L 27/0886; H01L 27/0924; H01L 29/0657; H01L 29/66795; H01L 29/7849; H01L 2027/11853; H01L 2027/11864; H01L 21/02532; H01L 21/0273; H01L 21/28088; H01L 21/283; H01L 21/31155; H01L 21/32105; H01L 21/32134; H01L 21/32139; H01L 21/76224; H01L 21/823431; H01L 27/098; H01L 27/11807;

(Continued)

(56) References Cited

U.S. PATENT DOCUMENTS 7,425,740 B2 9/2008 Liu et al.
7,667,271 B2 2/2010 Yu et al.

(Continued)

FOREIGN PATENT DOCUMENTS

CN 104078362 A 10/2014
CN 104979204 A 10/2015

*Primary Examiner* — Edward Chin
(74) *Attorney, Agent, or Firm* — Haynes and Boone, LLP

(57) ABSTRACT

A semiconductor layer is etched into a plurality of fin structures. A first nitridation process is performed to side surfaces of the fin structures. The first nitridation process forms a first oxynitride layer at the side surfaces of the fin structures. A liner oxide layer is formed on the first oxynitride layer. An isolation structure is formed around the fin structures after the forming of the liner oxide layer.

20 Claims, 11 Drawing Sheets

Related U.S. Application Data

(60) Provisional application No. 62/355,389, filed on Jun. 28, 2016.

(51) Int. Cl.
*H01L 29/78* (2006.01)
*H01L 21/762* (2006.01)
*H01L 21/8234* (2006.01)
*H01L 21/8238* (2006.01)

(52) U.S. Cl.
CPC .. *H01L 21/02247* (2013.01); *H01L 21/02271* (2013.01); *H01L 21/02532* (2013.01); *H01L 21/02592* (2013.01); *H01L 21/02634* (2013.01); *H01L 21/76237* (2013.01); *H01L 21/823481* (2013.01); *H01L 21/823821* (2013.01); *H01L 29/66545* (2013.01); *H01L 29/66795* (2013.01); *H01L 29/7851* (2013.01); *H01L 29/7853* (2013.01)

(58) Field of Classification Search
CPC .............. H01L 29/045; H01L 29/0673; H01L 29/0847; H01L 29/1058; H01L 29/1066; H01L 29/41741; H01L 29/41791; H01L 29/42392; H01L 29/4966; H01L 29/66545; H01L 29/66553; H01L 29/66742; H01L 29/66803; H01L 29/66893; H01L 29/66909; H01L 29/7832; H01L 29/785; H01L 29/7851; H01L 29/78696; H01L 29/8083; H01L 29/7853; H01L 21/02592; H01L 21/02634; H01L 21/823481; H01L 21/0214; H01L 21/76237; H01L 21/02164; H01L 21/02271; H01L 21/02247

See application file for complete search history.

(56) References Cited

U.S. PATENT DOCUMENTS

| | | | |
|---|---|---|---|
| 7,842,566 B2 * | 11/2010 | Lee ...................... | H01L 29/045 257/E21.433 |
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,105,490 B2 | 8/2015 | Wang et al. | |
| 2003/0151077 A1 | 8/2003 | Mathew et al. | |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2015/0263003 A1 | 9/2015 | Lee et al. | |
| 2015/0311341 A1 * | 10/2015 | Hur .................. | H01L 21/02532 257/190 |
| 2016/0293602 A1 * | 10/2016 | Liu .................. | H01L 27/098 |
| 2017/0033013 A1 | 2/2017 | Kim et al. | |
| 2017/0110476 A1 * | 4/2017 | Ching ............. | H01L 27/11807 |
| 2017/0148890 A1 * | 5/2017 | Ando .................. | H01L 27/0886 |
| 2017/0236722 A1 * | 8/2017 | Fan .................. | H01L 29/0657 257/623 |

* cited by examiner

SYSTEM AND METHOD FOR WIDENING FIN WIDTHS FOR SMALL PITCH FINFET DEVICES

PRIORITY DATA

This application is a divisional of U.S. application Ser. No. 15/261,302, filed Sep. 9, 2016 which claims priority to U.S. Provisional Patent Application Ser. No. 62/355,389, filed on Jun. 28, 2016, the entire disclosures of which are hereby incorporated herein by reference.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. One drawback is that, as the pitch size continues to shrink, it may be difficult to achieve a fin width target that is wide enough. For example, as FinFET fabrication reaches a pitch size of 30 nanometers or below, the fin widths may be too small (e.g., smaller than 6 nanometers). Such a small fin width may lead to unintended bending or even collapse of the fin. The small fin width may also induce carrier mobility degradation. Consequently, device performance is compromised, or device failure rate may increase. Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
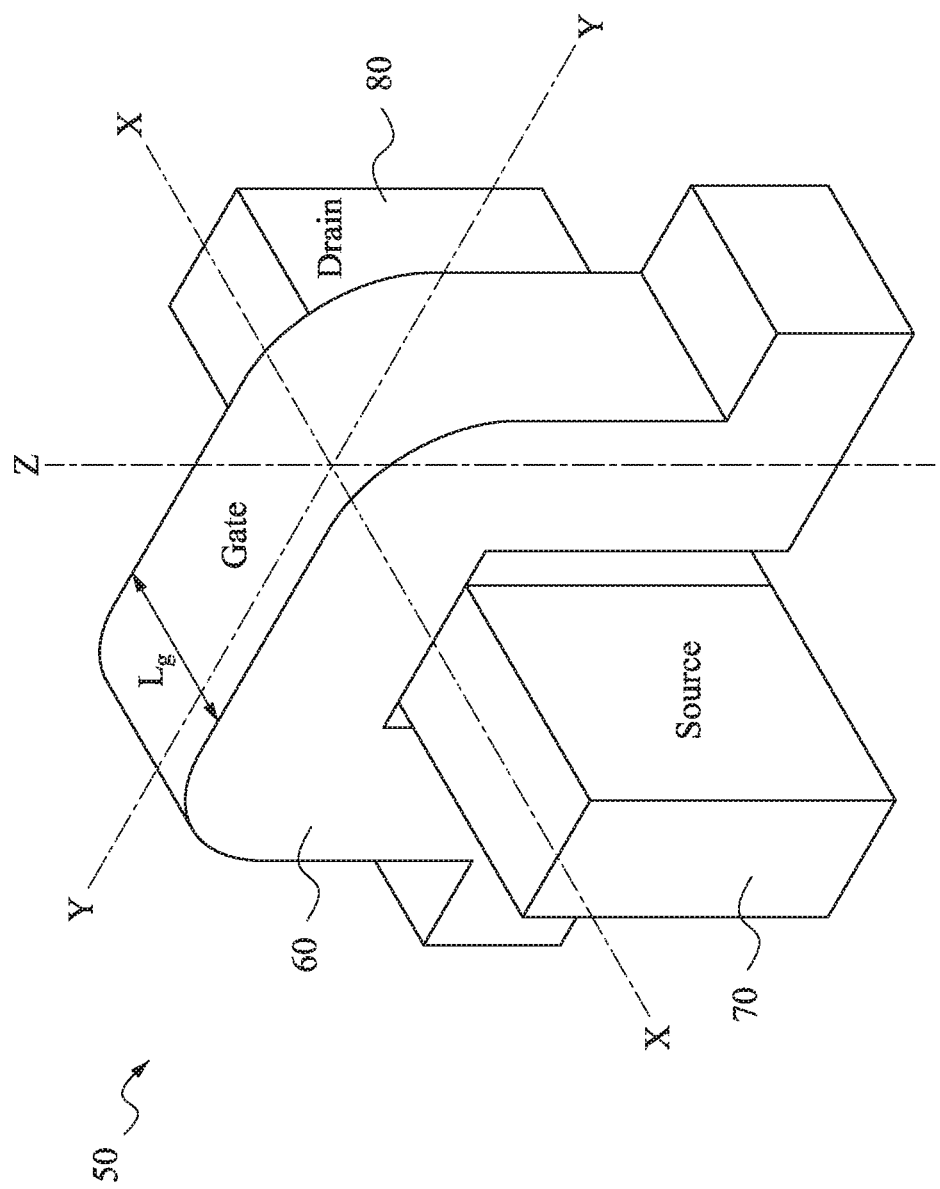
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present invention. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings. For example, as the pitch size for FinFET devices continues to shrink, it may be difficult for conventional FinFET fabrication to achieve a target pitch size while also maintaining a sufficiently thick fin width for the FinFET devices. For FinFET devices with a pitch size of 30 nanometers or below, conventional FinFET fabrication may lead to FinFETs whose fin widths are several nanometers (e.g., 3-6 nanometers) less than the target fin width. Such a small fin width may result in undesirable bending or even collapse of the fin. The smaller-than-desired fin width may also induce carrier mobility degradation. Consequently, conventional FinFET fabrication may lead to lower yields or degraded device performance as the pitch size shrinks (e.g., a pitch size smaller than about 30 nanometers).

To improve device performance and yield for FinFET devices, the present disclosure utilizes various fabrication techniques to fabricate FinFET devices with a sufficiently small pitch while also enlarging the otherwise small fin width, thereby achieving a desired critical dimension target for the FinFET, as discussed in more detail below with reference to FIGS. 1-18.

FIGS. 2-15 are three-dimensional perspective views of a FinFET device 100 at various stages of fabrication. The FinFET device 100 is fabricated over a substrate, which is not specifically illustrated herein for reasons of simplicity. In some embodiments, the substrate includes a dielectric material, for example silicon oxide (SiO2). Other suitable materials may also be used for the substrate in alternative embodiments.

Figure 2:
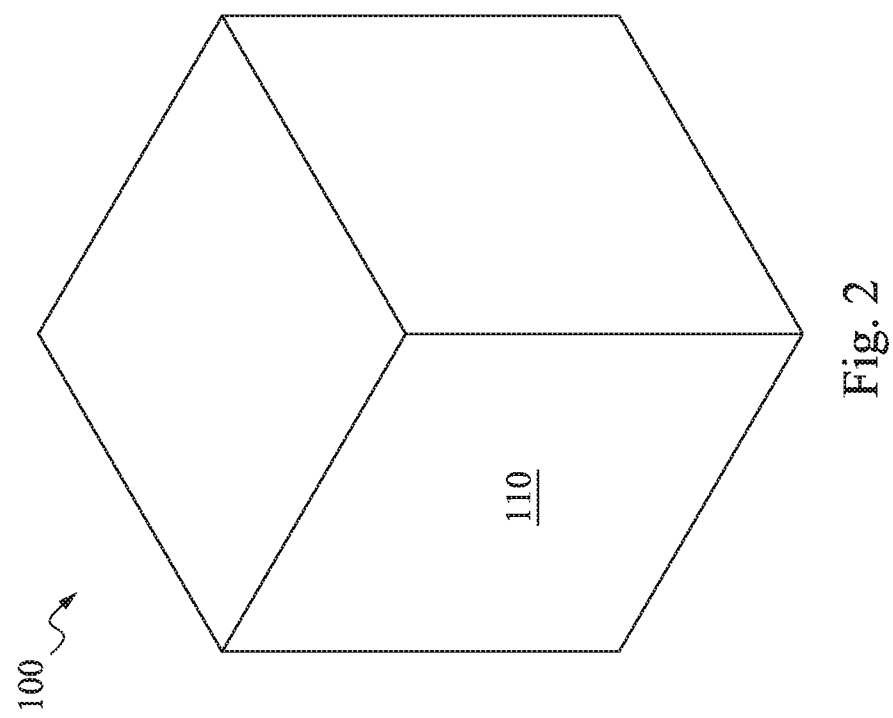

Referring to FIG. 2, a semiconductor layer 110 is formed over the substrate. In an embodiment, the semiconductor layer 110 includes a crystal silicon material. An implantation process (e.g., an anti-punch-through implantation process) may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 110 is in a range from about $1\times10^{17}$ ions/cm3 to about $5\times10^{19}$ ions/cm3.

Figure 3:
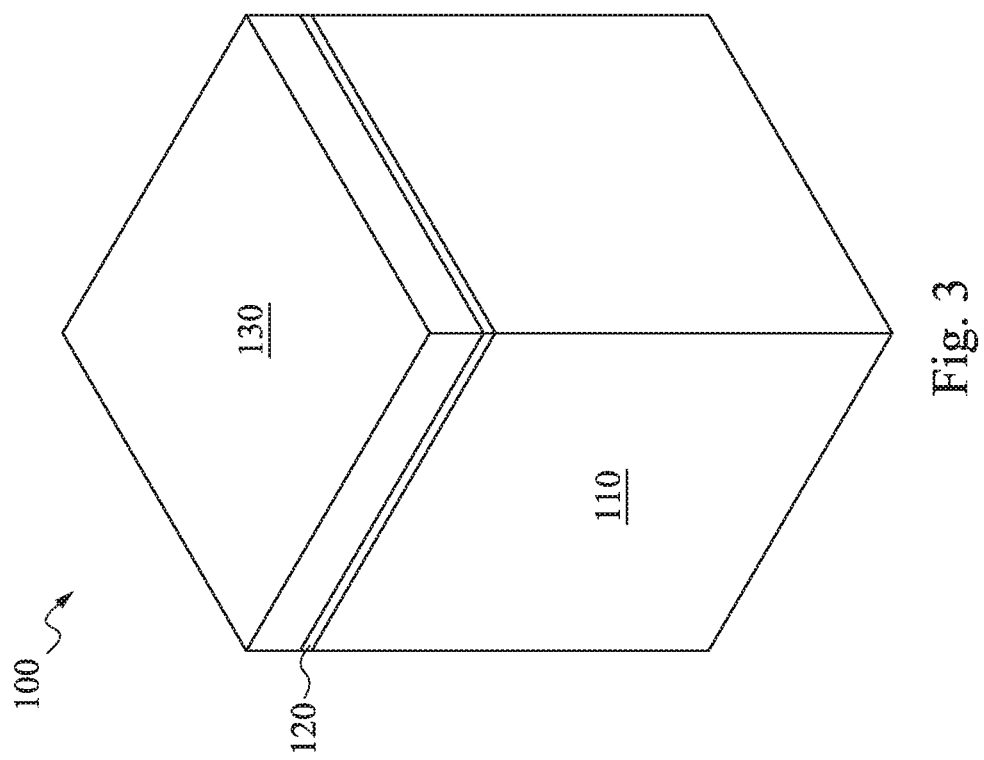
FIGS. 2-15 are perspective three-dimensional views of a FinFET device at different stages of fabrication according to various embodiments of the present disclosure.

Referring now to FIG. 3, a dielectric layer 120 is formed over the semiconductor layer 110. In some embodiments, the dielectric layer 120 contains silicon oxide. A dielectric layer 130 is formed over the dielectric layer 120. The dielectric layer 130 has a different material composition than the dielectric layer 120. In some embodiments, the dielectric layer 130 contains silicon nitride. The dielectric layers 120 and 130 collectively serve as a hard mask layer, which can be used to pattern the semiconductor layer 110 therebelow.

Figure 4:
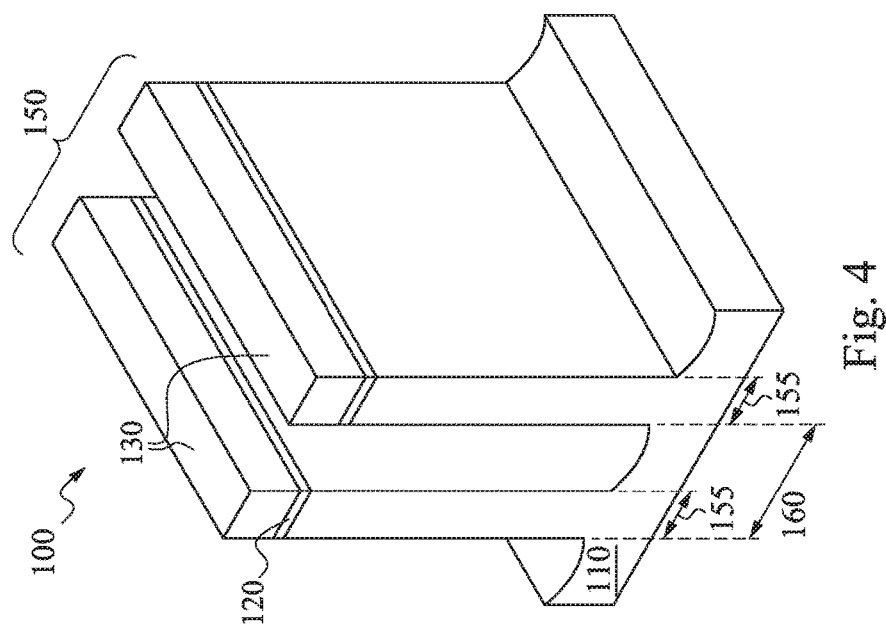

Referring now to FIG. 4, the dielectric layers 130, 120, and the semiconductor layer 110 are patterned through one or more lithography processes to form fin structures (or fins) 150. The lithography processes may include forming a patterned photoresist (not illustrated herein), which may be formed by processes such as deposition, exposure, developing, baking, etc. (not necessarily performed in that order). The patterned photoresist may then be used to pattern the dielectric layers 120-130 below, which are then used as a patterned hard mask to pattern the fin structures 150 by etching away portions of the semiconductor layer 110 not protected by the patterned hard mask. The resulting fin structures 150 are portions of the semiconductor layer 110 that protrude vertically upward (along the Z-direction or axis shown in FIG. 1) out of the unetched portion of the semiconductor 110, and they each extend along the X-direction in FIG. 1. It is understood that portions of the fin structures 150 (or the semiconductor material therein) will serve as the source, drain, and channel regions of the FinFET device 100.

The fin structures 150 each have a width 155. The width 155 is a lateral dimension that is measured along the Y-direction or axis shown in FIG. 1. As discussed above, as a pitch 160 (e.g., distance between a sidewall of one fin structure 150 to the closest sidewall of an adjacent fin structure) of the FinFET devices decreases, the width 155 of the fin structures 150 may become too thin. For example, as the pitch 160 reaches 30 nanometers or below, the width 155 of the fin structures may become too small, for example in a range from 6 nanometers to 9 nanometers, when the desired width 150 should be around 12 nanometers. This may be due to the process limitations of the lithography processes (e.g., patterning and etching processes) performed to form the fin structures 150. In some cases, the etching of the semiconductor layer 110 (in order to form the fin structures) may not be able to define a small enough opening separating the adjacent fin structures 150. Accordingly, if the pitch size 160 is to be maintained below a certain target, the width 155 of the fin structures 150 may become too narrow. Again, the unduly narrow width 155 may cause the fin structures 150 to bend sideways or even collapse. In addition, carrier mobility is degraded because of the narrow width 155 as well. The present disclosure overcomes this problem by "widening" the fin structures 150, as discussed in more detail below.

Figure 5:
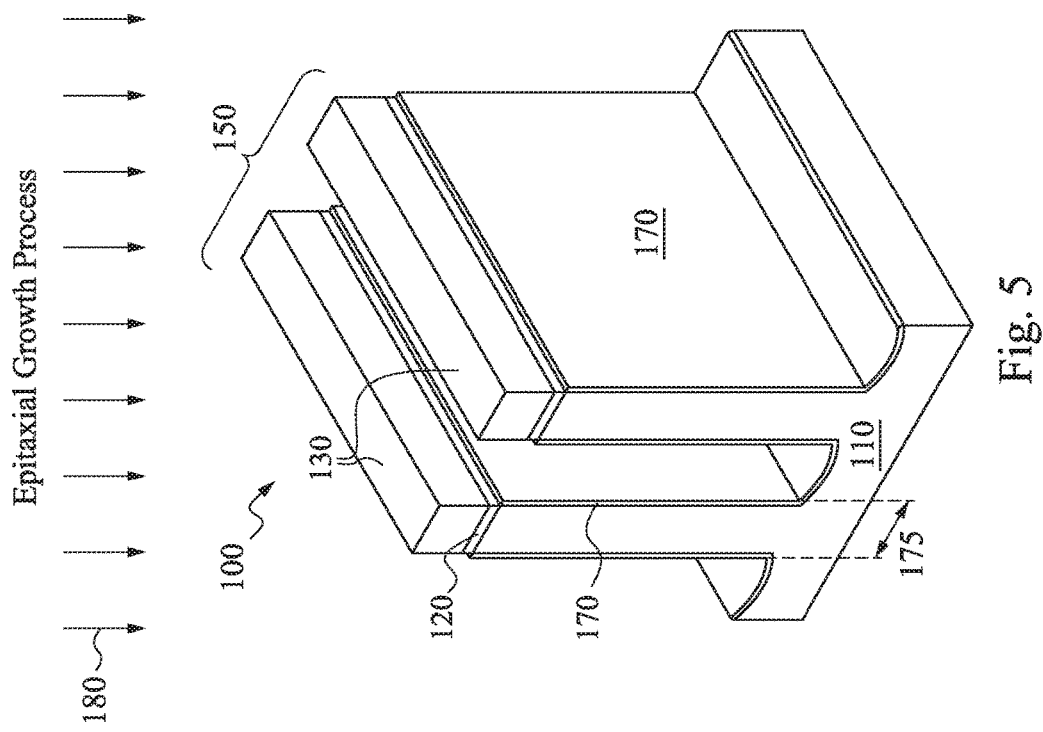

Referring now to FIG. 5, an amorphous silicon layer 170 is formed on the surfaces of the semiconductor layer 110 and on the side surfaces of the fin structures 150. In some embodiments, the amorphous silicon layer 170 is formed by an epitaxial growth process 180. The epitaxial growth process 180 allows the amorphous silicon layer 170 to be grown in a conformal manner—that is, with even or uniform thickness on the side surfaces of the fin structures 150. As such, the conformal growth of the amorphous silicon layer 170 effectively widens the width 155 of each of the fin structures to a width 175.

The amount of widening can be controlled as well. For example, the thickness of the amorphous silicon layer 170 is a function of a process duration of the epitaxial growth process 180. The longer the process duration, the thicker the amorphous silicon layer 170. Thus, if the desired width of the fin structures is M nanometers, and the actual fin width 155 (before the widening) is N nanometers, that means the epitaxial growth process 180 needs to be configured to grow the amorphous silicon layer 170 to have a thickness of (M−N)/2 nanometers in order to achieve the target width. This can be easily achieved by tuning the process parameters such as processing time/duration for the epitaxial growth process 180. In some embodiments, the epitaxial growth process 180 is performed using a $SiH_4$(in $H_2$) precursor, with a process temperature in a range from 450 degrees Celsius to 600 degrees Celsius, and with a process time in a range from 100 seconds to 300 seconds.

Figure 6:
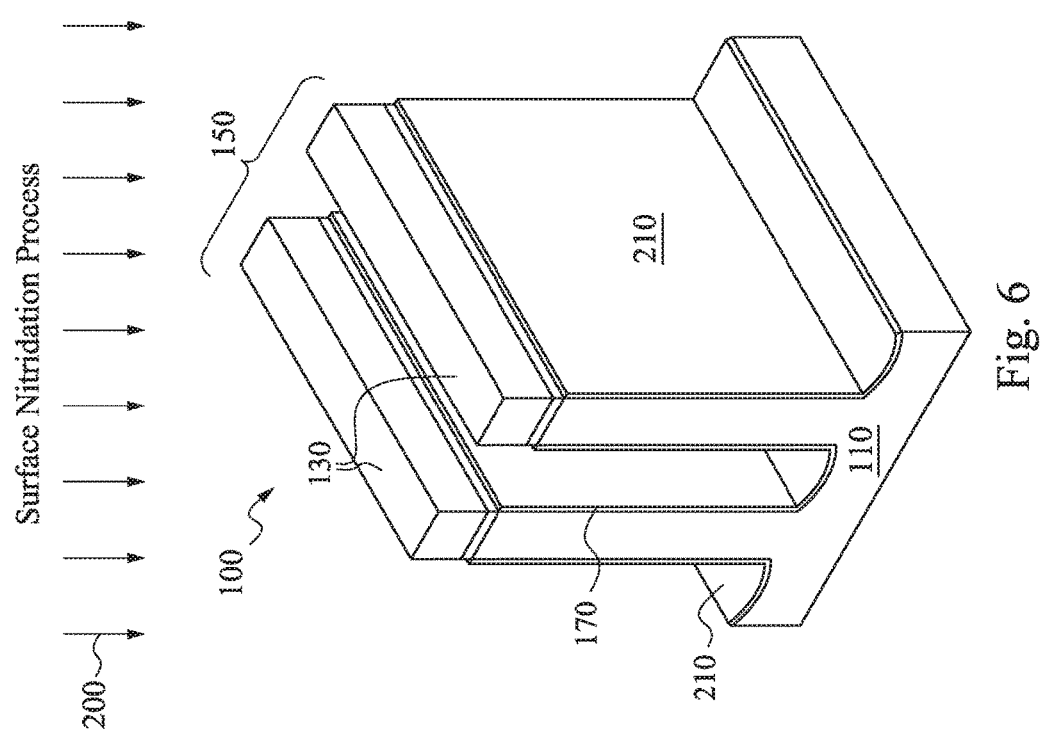

Referring now to FIG. 6, a surface nitridation process 200 is performed to the FinFET device 100 to form a nitrogen-containing layer 210 (such as an oxynitride layer) on the amorphous silicon layer 170. In some embodiments, the surface nitridation process 200 includes a rapid thermal nitridation (RTN) process. After the formation of the amorphous silicon layer 170 in FIG. 5, the amorphous silicon layer 170 may come into contact with oxygen (e.g., oxygen in the air). As a result, a thin layer of native oxide (5 to 8 angstroms) may be formed on the amorphous silicon layer 170. This native oxide layer is converted into oxynitride by the surface nitridation process 200 to form the nitrogen-containing layer 210.

Figure 7:
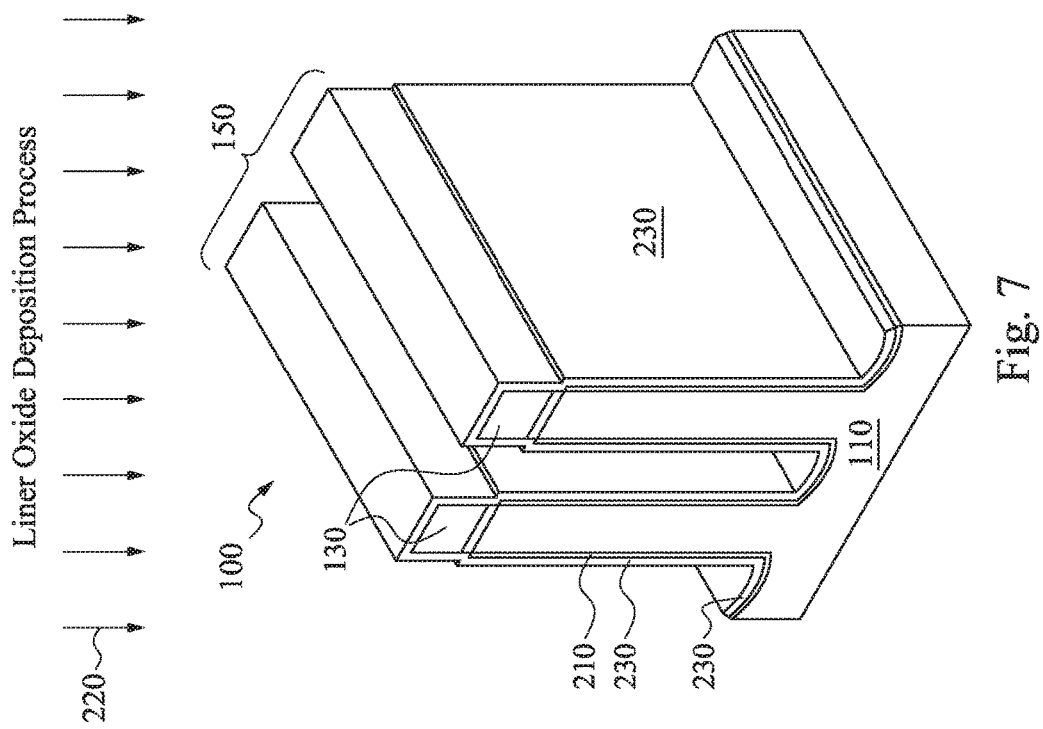

Referring now to FIG. 7, a liner oxide deposition process 220 is performed to the FinFET device 100 to form a liner oxide layer 230 over the nitrogen-containing layer 210. An annealing process is also performed following the liner oxide deposition. One reason for the performance of the liner oxide deposition process 220 is to repair or remove damages to the fin structures during the etching of the fin structures. The resulting liner oxide layer 230 also effectively "thickens" the oxynitride layer discussed above.

Figure 8:
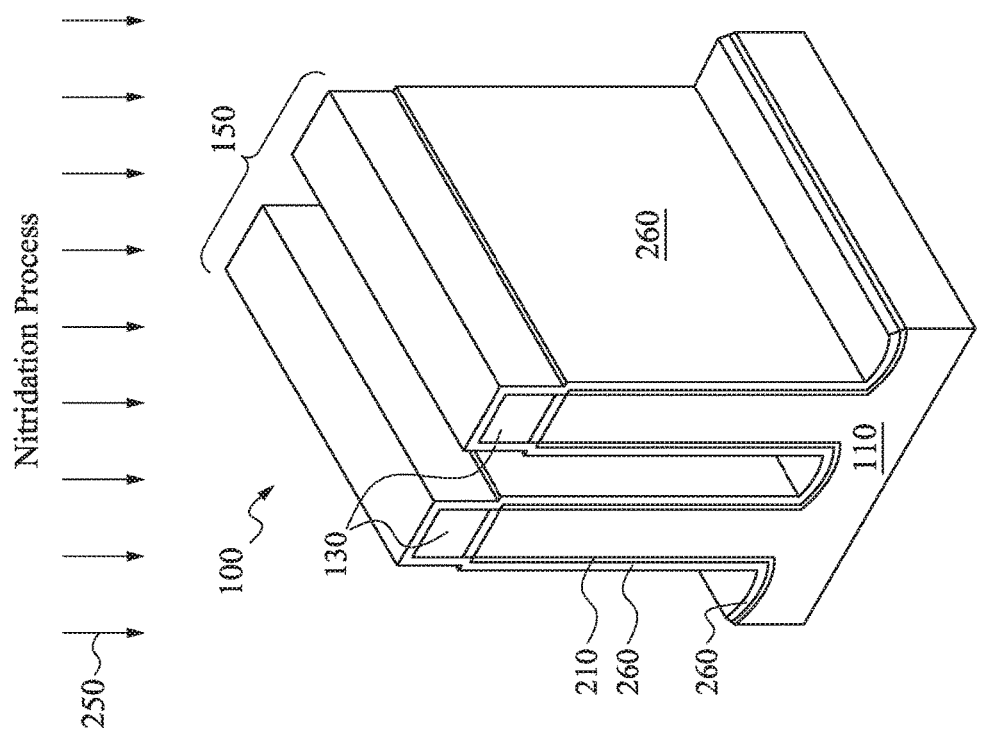

Referring now to FIG. 8, another nitridation process 250 is performed to the FinFET device 100 to form another nitrogen-containing layer 260. In some embodiments, the nitridation process 250 substantially converts the liner oxide layer 230 (FIG. 7) to an oxynitride material. One purpose of the nitridation process 250 is to further increase the nitrogen content in the layer in a location that is not immediately adjacent to the surfaces of the fin structures 150. The increased nitrogen content in the layer 260 helps prevent potential oxidation to the silicon material of the fin structures 150 that may otherwise occur in a subsequent fabrication process discussed below.

Figure 9:
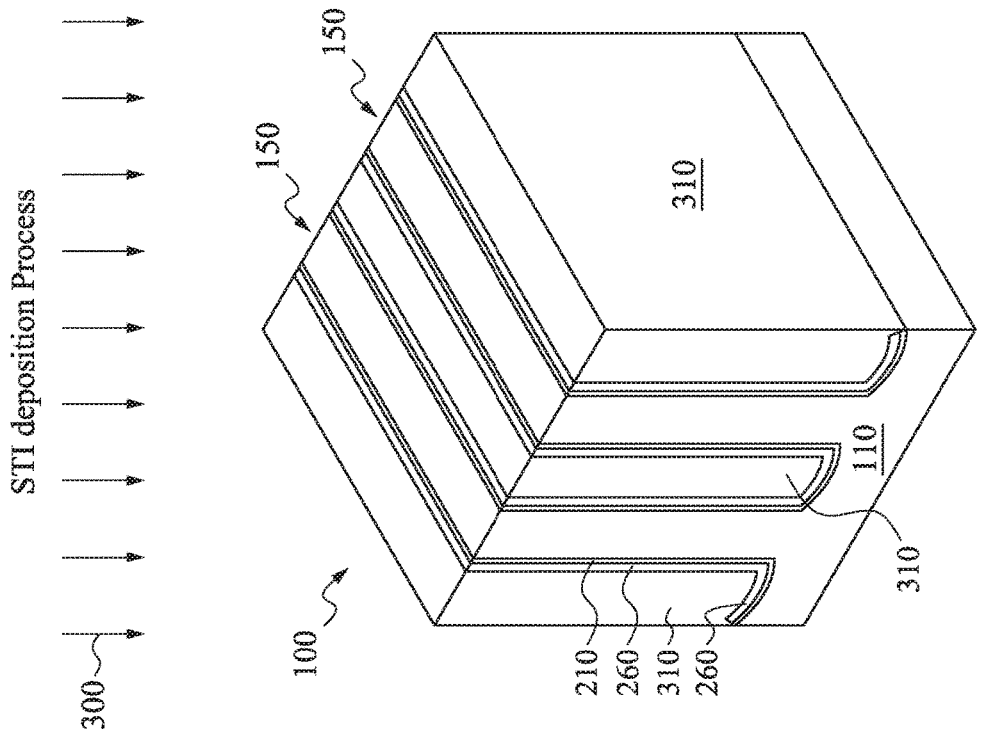

Referring now to FIG. 9, an STI (shallow trench isolation) deposition process 300 is performed to the FinFET device 100 to form an STI 310 as a dielectric isolation structure to electrically isolate the fin structures 150. In some embodiments, the STI deposition process 300 includes a flow-able chemical vapor deposition (FCVD) process, followed by an annealing process. The STI 310 fills the openings between (and around) the fin structures 150. Thus, the fin structures 150 are now embedded in the STI 310. The dielectric layers 130 and 120 (shown in FIGS. 3-8) are also removed, which may be performed before or after the formation of the STI 310.

One reason for the performance of the nitridation process 250 (discussed above with reference to FIG. 8) is to prevent oxidation of the silicon material of the fin structures 150. In more detail, the performance of the FCVD process (used to form the STI 310) involves exposing the FinFET device 100 to a significant amount of oxygen. If the fin structures 150 had not been protected when the FCVD process was performed, then the silicon material of the fin structures may be easily oxidized and therefore consumed. This is undesirable, especially since the fin structures 150 are already somewhat thin in the first place.

According to the embodiments of the present disclosure, the nitridation process performed in FIG. 8 forms the nitrogen-containing layer 260 around the fin structures 150. The nitrogen-containing layer 260 serves as a protective layer for the FinFET device 100 as the FCVD process is performed, since the nitrogen-containing layer 260 may react with the oxygen (associated with the FCVD process) to form oxynitride, thereby preventing the oxygen from oxidizing or consuming the fin structures 150. As the nitrogen content of the nitrogen-containing layer 260 increases as a function of a distance away from the side surfaces of the fin structures 150, the nitrogen-containing layer 260 becomes a more effective structure for "blocking" the oxygen from undesirably oxidizing the fin structures 150. This will be discussed in further detail below with reference to FIG. 17 later.

Figure 10:
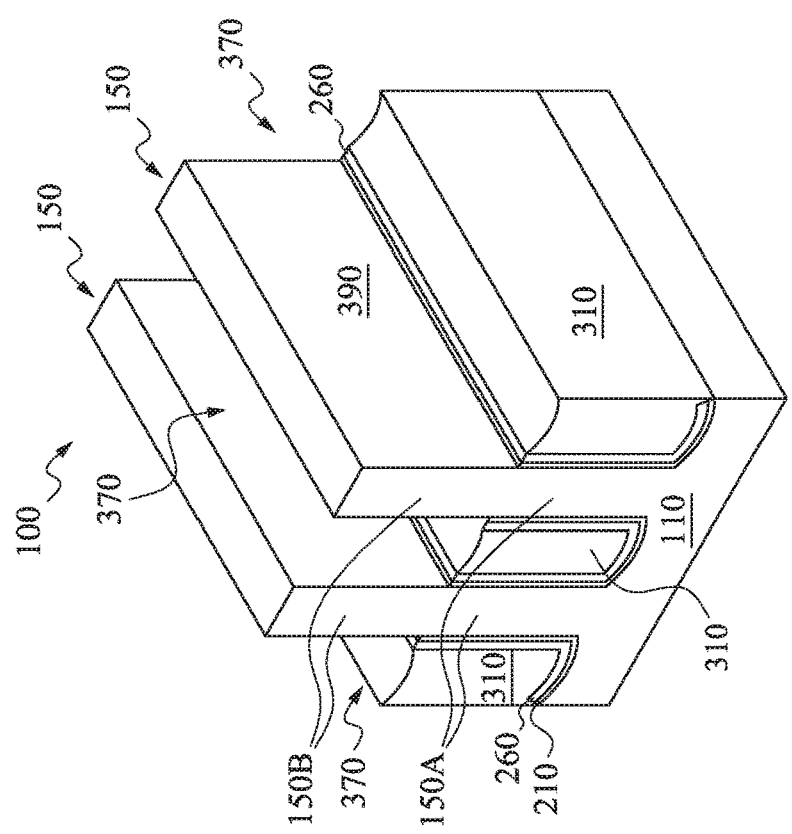

Referring now to FIG. 10, one or more etching processes are performed to the FinFET device 100 to form recesses 370. The recesses 370 are formed by removing portions (but not all) of the material from the STI 310. At this point, the fin structures 150 partially protrude vertically upwards and out of the STI 310. In other words, a segment 150A of each fin structure is embedded in a remaining portion of the STI 310, while a different segment 150B (separated visually from the segment 150A by conceptual broken lines in FIG. 10) of each fin structure is exposed and not covered by the STI 310. As is shown in FIG. 10, the segments 150A of the fin structures have the nitrogen-containing layers (e.g., layer 160) disposed adjacent to their sidewalls, while the segments 150B of the fin structures do not.

Figure 11:
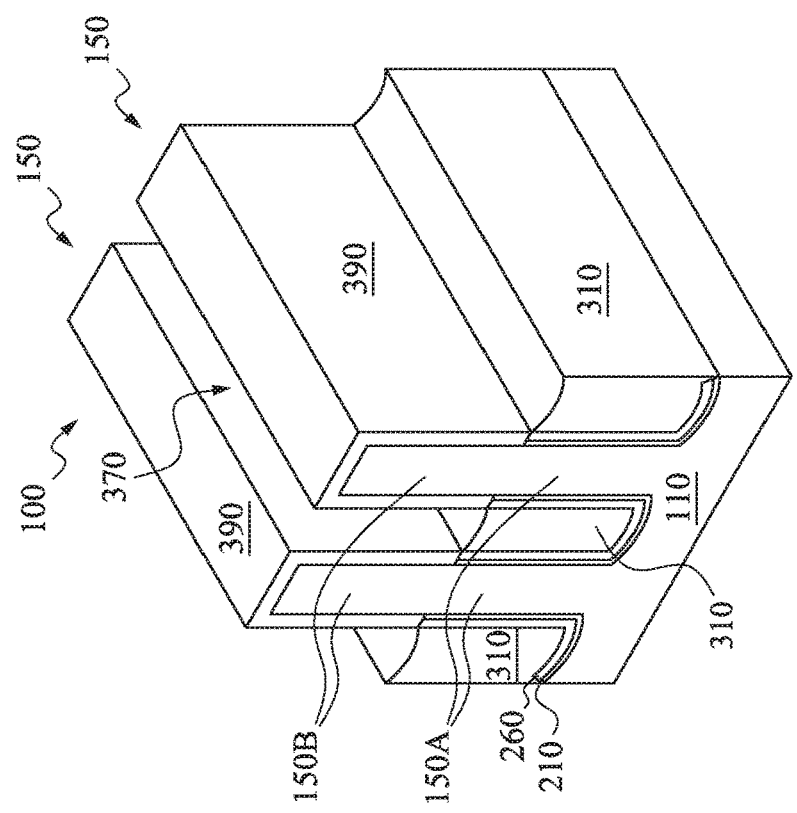

Referring now to FIG. 11, a dummy gate dielectric layer 390 is formed on the exposed portions of the fin structures 150 (i.e., the segments 150B). In some embodiments, the dummy gate dielectric layer 390 includes silicon oxide. The dummy gate dielectric layer 390 will be removed later as a part of a gate replacement process.

Figure 12:
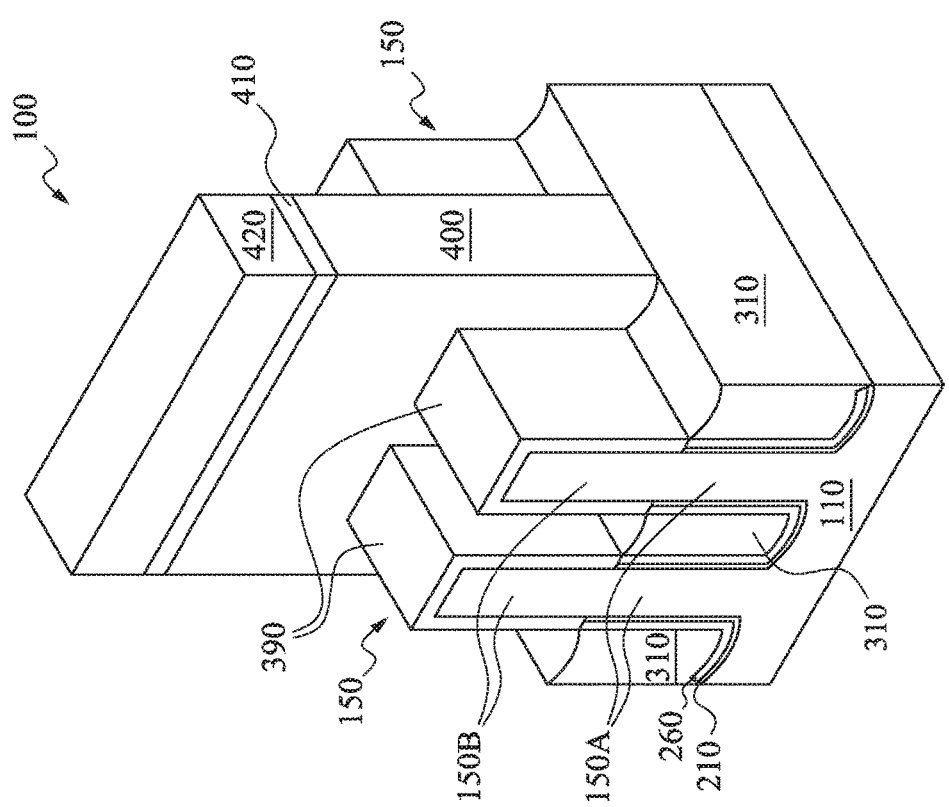

Referring now to FIG. 12, a patterned dummy gate electrode 400 is formed over STI 310 and is formed to "wrap around" each of the fin structures 150. The patterned dummy gate electrode 400 is formed by one or more patterning processes. For example, a polysilicon material is formed over the isolation structures 160. A patterned hard mask is then formed over the polysilicon material. The patterned hard mask includes a dielectric layer 410 and a dielectric layer 420. In some embodiments, the dielectric layer 410 contains silicon nitride, and the dielectric layer 420 contains silicon oxide. The patterned hard mask is then used to pattern (e.g., by one or more etching processes) the polysilicon material below to form the patterned dummy gate electrode 400. The dummy gate electrode 400 will also be removed later along with the dummy gate dielectric 390 as a part of the gate replacement process.

Figure 13:
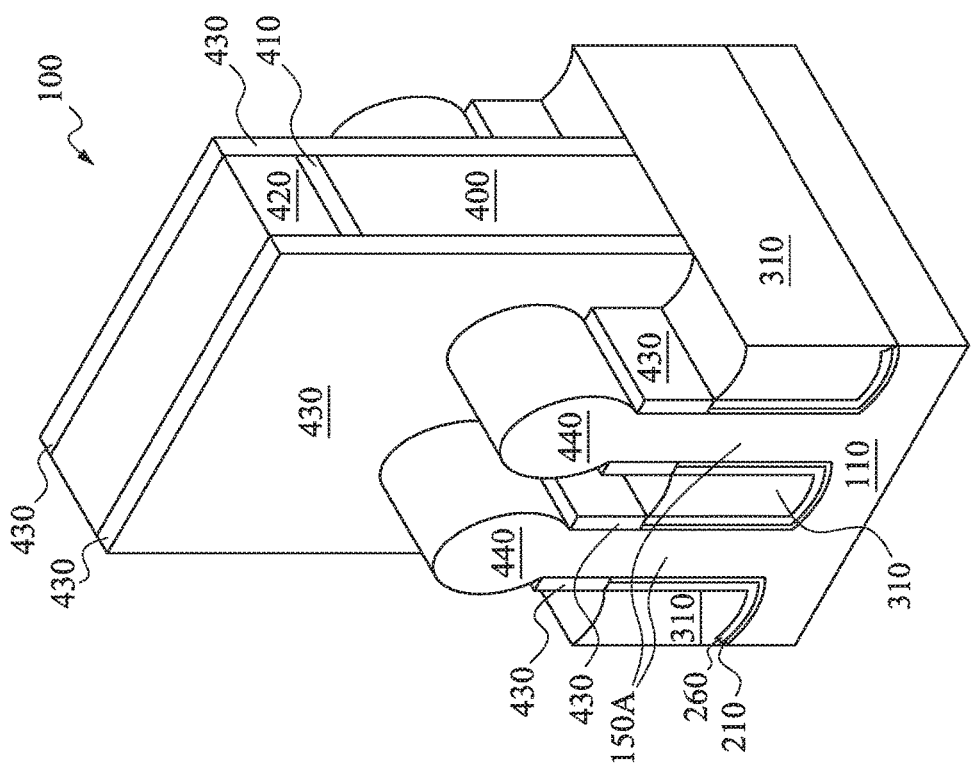

Referring now to FIG. 13, spacers 430 are formed on the sidewalls of the dummy gate electrode 400 and the dielectric layers 410-420. The spacers 430 may be formed by depositing a dielectric material and then etching the dielectric material. In some embodiments, the spacers 430 contain silicon carbon oxynitride (SiCON). In other embodiments, the spacers 430 contain silicon oxycarbide (SiOC).

In addition, source/drain regions 440 are formed. The source and drain regions 440 are formed by first removing the dummy gate dielectric layer 390 and portions of the fin structures 150 located on opposite sides of the spacers 430 located on the sidewalls of the dummy gate electrode 400. This removal process forms openings defined by some segments of the spacers 430. Subsequently, an epitaxial growth process is performed to grow the source/drain regions 440 in the openings. As is shown in FIG. 13, some portions of the source/drain regions 440 protrude vertically upward out of the openings.

Figure 14:
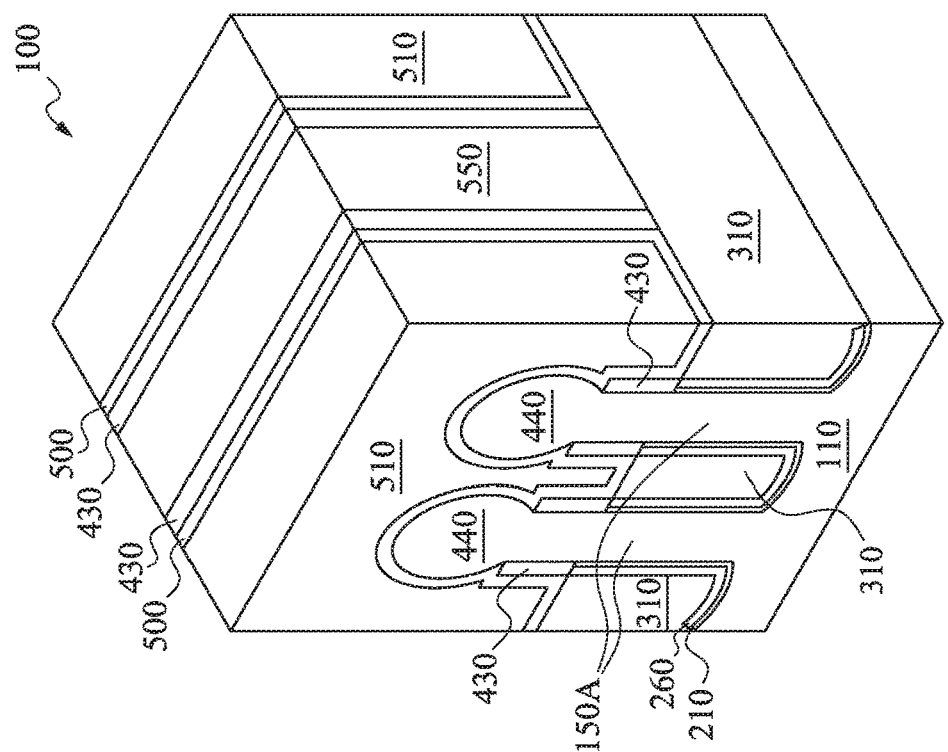

Referring now to FIG. 14, a dielectric layer 500 is formed on the sidewalls of the spacers 430, and an interlayer dielectric (ILD) 510 is formed over the STI and on the sidewalls of the dielectric layer 500. In some embodiments, the ILD 510 contains silicon oxide, and the dielectric layer 500 contains silicon nitride. The ILD 510 and the dielectric layer 500 may be formed by one or more deposition processes followed by a polishing process such as chemical-mechanical-polishing (CMP) that is performed to planarize the upper surface of the ILD 510. The dielectric layers 410 and 420 are also removed, as are the dummy gate electrode 400 and dummy gate dielectric layer 390. As a result, an opening 520 is formed.

Figure 15:
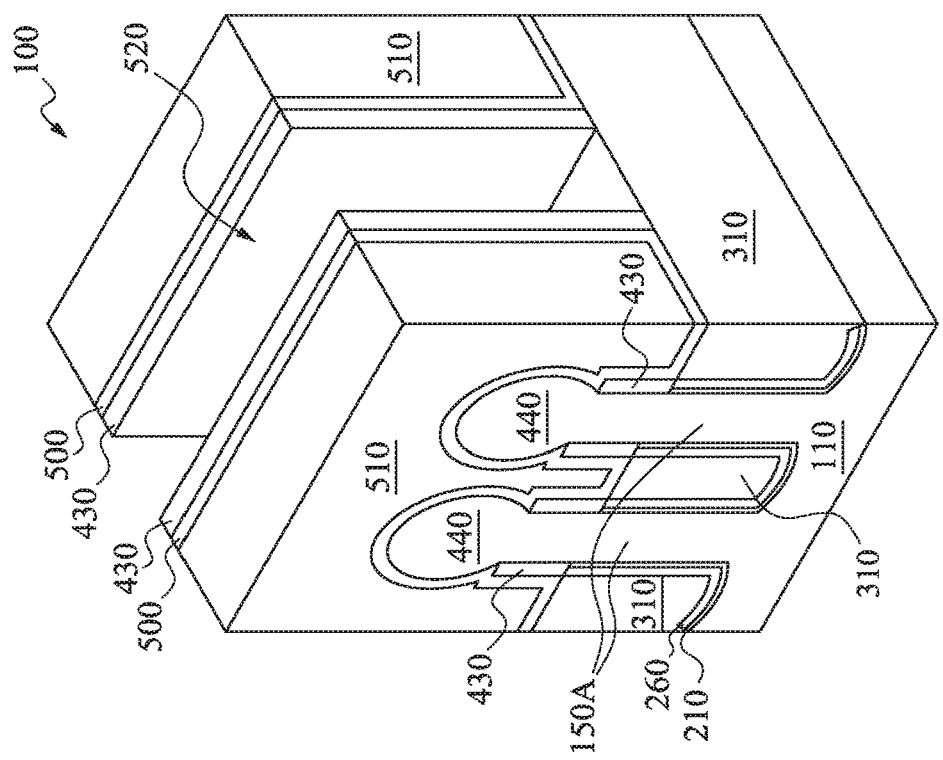

Referring now to FIG. 15, a functional gate structure 550 is formed in the opening 520. In some embodiments, the functional gate structure 550 includes a high-k gate dielectric and a metal gate electrode. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 320. In various embodiments, the fill metal component may contain Aluminum (Al), Tungsten (W), Copper (Cu), or combinations thereof. The replacement of the dummy gate structure 200 by the functional gate structure 320 may be referred to as a gate replacement (or gate last) process. Since the metal gate electrode of the gate structure 550 is what is mostly shown in the Figures herein, the gate structure 550 may also be interchangeably referred to as a metal gate electrode hereinafter for reasons of simplicity.

It is understood that the fabrication process flow discussed above with reference to FIGS. 2-15 is merely an example and not intended to be limiting. Some of the processing steps may be changed or omitted in alternative embodiments. For example, in one alternative embodiment, the nitridation process 250 discussed above with reference to FIG. 8 may be omitted. In another alternative embodiment, the epitaxial growth process 180 discussed above with reference to FIG. 5 may be omitted.

Figure 16:
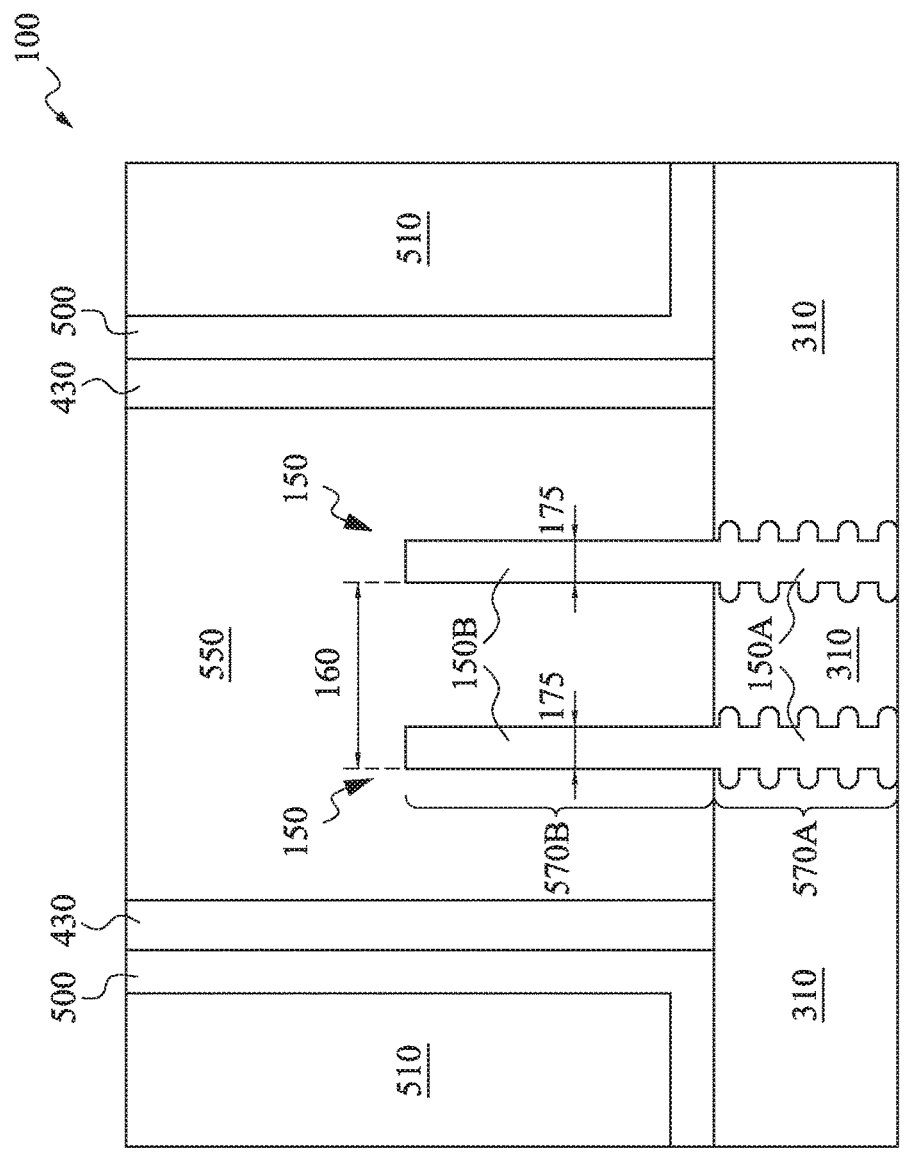
FIGS. 16-17 are different cross-sectional side views of a FinFET device according to various embodiments of the present disclosure

The unique fabrication process flow of the present disclosure forms a FinFET device with distinct physical characteristics. Referring now to FIG. 16, a simplified diagrammatic cross-sectional side view of the FinFET device 100 is illustrated according to an embodiment. The cross-sectional side view is taken across the Y-axis illustrated in FIG. 1 on the gate electrode 550. As discussed above with reference to FIG. 4, a small fin pitch 160 (e.g., distance between a sidewall of one fin structure 150 to the sidewall of an adjacent fin structure) can be achieved. For example, the fin pitch 160 may be less than or equal to 30 nanometers. Meanwhile, a sufficiently wide fin width 175 (discussed above with reference to FIG. 5) can also be achieved. This is because the epitaxial growth process 180 (FIG. 5) allows amorphous silicon to be grown conformally on the sidewall surfaces of the fin structures, thereby widening the fin width 175 to a desired target. For example, in an embodiment where the target fin pitch 160 is 30 nanometers, a fin width 175 of 12 nanometers or greater can be achieved.

Also as discussed above with reference to FIG. 10, each fin structure 150 may be conceptually divided into a segment 150A and a segment 150B disposed over the segment 150A (separated by artificial boundaries illustrated as dashed lines herein). The segments 150A are embedded within, or surrounded by, the STI 310. The segments 150B are embedded within, or surrounded by, the metal gate electrode 550. As is shown in FIG. 16, sidewall surfaces 570A of the segments 150A are rougher than sidewall surfaces 570B of the segments 150B. In other words, the surfaces 570A have greater surface topography variations (e.g., a difference between a highest point on a surface and a lowest point on the surface) than the surfaces 570B. In some embodiments, the surface topography variation for the surfaces 570B is less than 5 angstroms, but the surface topography variation for the surfaces 570A is greater than 5 angstroms, for example greater than 10 angstroms. In some embodiments, the surface topography variations of the surfaces 570A and 570B—as a representation of surface roughness—can be detected by using techniques such as transmission electron microscopy (TEM) or atomic-force microscopy (AFM).

One reason for the difference in roughness between the surfaces 570A and 570B is due to the epitaxial growth used to form the amorphous silicon to widen the fin widths 175. The amorphous silicon recrystallizes after high temperature annealing, and as a result roughens the surfaces of the fin structures 150. Then the STI 310 is etched (in FIG. 10) in order to expose the fin structure segments 150B. As such, the roughened sidewall surfaces of the segments 150B are etched away, but the roughened sidewall surfaces of the segments 150A still remain due to being surrounded by the STI 310. Hence, a difference in roughness or surface topography between the segments 150A and 150B of the fin structures is apparent, as shown in FIG. 16. This is one of the unique signature characteristics of the FinFET device 100 fabricated according to the embodiments of the present disclosure.

Another unique characteristic of the FinFET device 100 is the difference in nitrogen content between the materials surrounding the segments 150A and the materials surrounding the segments 150B. In more detail, a nitrogen content is distributed as a function of distance from the fin structures 150 is crudely illustrated in FIG. 17, which is also a simplified diagrammatic cross-sectional side view of the FinFET device 100 taken across the Y-axis on the metal gate electrode 550. The nitrogen content profile is represented by the curves 600 and 601, which illustrate how the nitrogen content varies in a non-linear manner as a function of location (or distance from the fin structures). In other words, the curves 600-601 vary horizontally in location/distance, and they vary vertically in nitrogen content.

The absence of the curves 600-601 in the metal gate electrode 550 indicates that the metal gate electrode 550 is free of nitrogen. In some embodiments, experimental data has been extracted to show that the nitrogen content is zero in the metal gate electrode 550. In other embodiments, due to various imperfections or limitations in real world processes (or contaminations), the nitrogen content in the metal gate electrode 550 may not necessarily be absolutely zero, but substantially approaches zero, for example in a range from about 0.01% to about 0.1%. In comparison, nitrogen exists in the dielectric layers surrounding the fin structure segments 150A. For example, nitrogen may exist in the nitrogen-containing layer 210, the nitrogen-containing layer 260, and the STI 310. The nitrogen content in these dielectric materials are visually illustrated according to the nitrogen profile curves 600-601, depending on whether it is a dense region or an iso region. In that regard, a dense region refers to a region between two adjacent fin structures 150. Thus, the region 310A of the STI (and the portions of the nitrogen-containing layers 210 and 260 adjacent thereto) are considered to be in the dense region. An iso region refers to a region that is disposed to one side of a fin structure 150, but not between two adjacent fin structures. Thus, the region 310B of the STI (and the portions of the nitrogen-containing layers 210 and 260 adjacent thereto) is considered the iso region. In some embodiments, the nitrogen content in the region 310B ranges from 3% to 10%.

Figure 17:
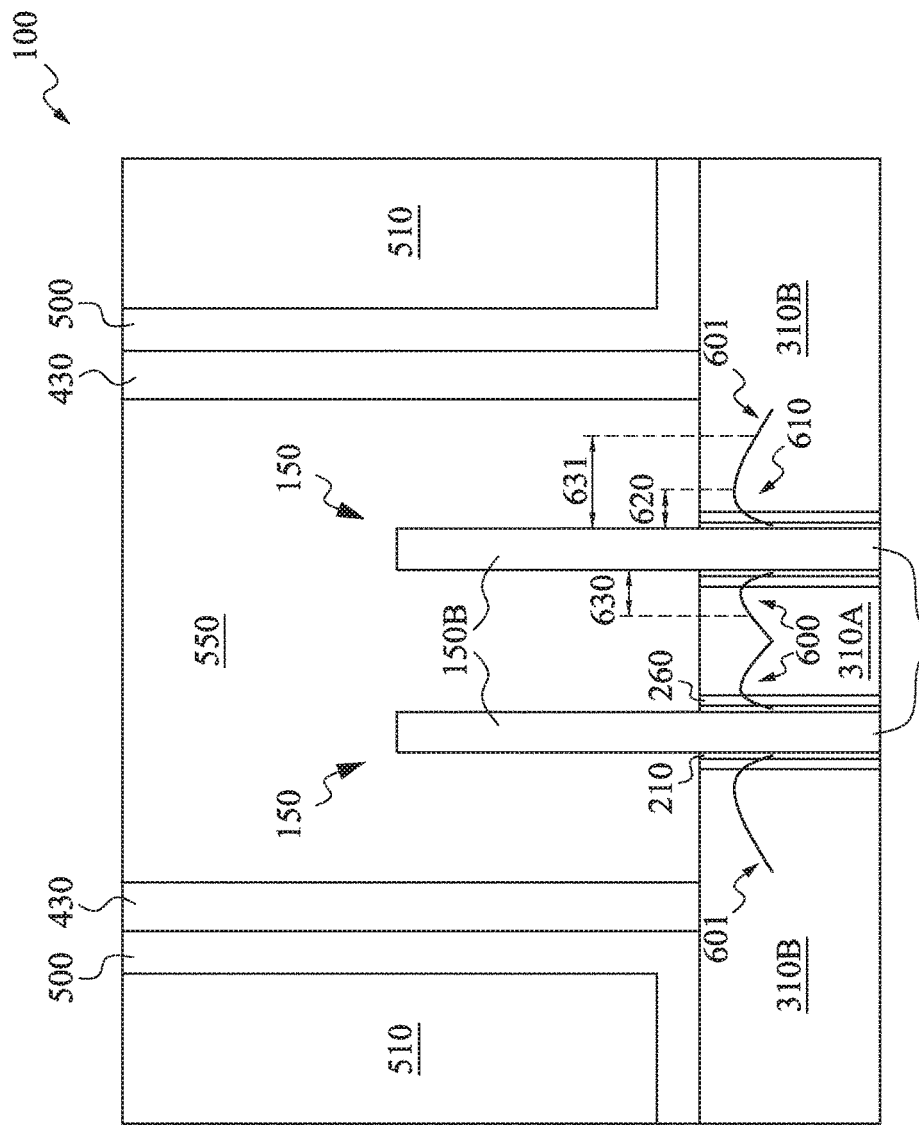

As is shown in FIG. 17, the iso region and the dense region have asymmetric (i.e., different) nitrogen content profiles. In more detail, the nitrogen profile curves 600-601 each rise up as the distance away from the sidewall surface of the fin structure 150 increases, until a peak 610 is reached. In some embodiments, the nitrogen content or concentration at the peak 610 is in a range from 4% to 10%. For both the iso region and the dense region, a distance 620 from the peak 610 to the sidewall surface of the fin structure segment 150A is similar (for the iso and dense regions), which is in a range from 3 nanometers to 8 nanometers in some embodiments. As discussed above, the fact that the peak nitrogen content is located at a distance 620 away from the sidewall surface of the fin structure segment 150A, rather than being in immediate proximity to the sidewall surface, helps protect the silicon of the fin structures not to be consumed by the oxygen in the FCVD process performed to form the STI 310 (discussed above with reference to FIG. 9), as the nitrogen reacts with oxygen involved in the FCVD process to form oxynitride. Without this nitrogen presence in the surrounding dielectric materials, the silicon in the fin structures may be oxidized, which is undesirable.

Still referring to FIG. 17, past this "peak distance" 620, the nitrogen content begins to decline as the distance away from the fin structure segment 150A further increases. Eventually the nitrogen content will reach zero. However, it can be seen in FIG. 17 that the rate of decline in the iso region is different from the rate of decline in the dense region. For example, the rate of decline is slower for the iso region than for the dense region. This rate of decline may be measured by "full width at half max distance" 630 and 631 for the dense region and the iso region, respectively. The "full width at half max distance" is a distance from the sidewall surface of the fin structure segment 150A at which the nitrogen content is 50% (half) of the peak nitrogen content.

As is shown in FIG. 17, the distance 630 (for the dense region) is shorter than the distance 631 (for the iso region), which means that the nitrogen content drops off more quickly or rapidly in the dense region (compared to the iso region) as the distance away from the fin structure increases. In some embodiments, the distance 630 is in a range from 3 nanometers to 8 nanometers (though it is understood that the distance 630 is greater than the "peak" distance 620), and the distance 631 is in a range from 5 nanometers to 12 nanometers. Again, the nitrogen profile discussed herein with reference to FIG. 17 is one of the unique characteristics of the FinFET 100 fabricated according to embodiments of the present disclosure.

Figure 18:
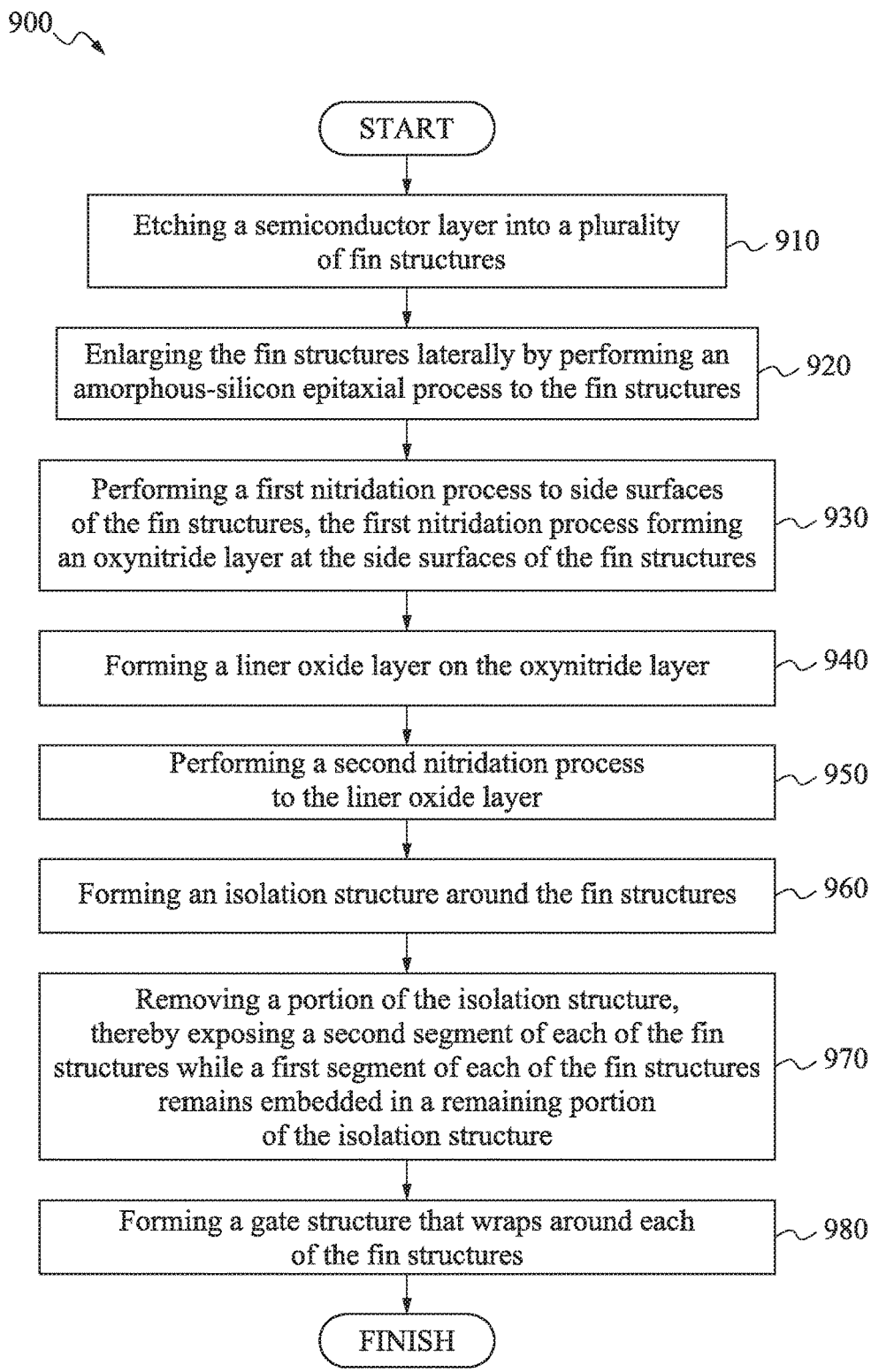
FIG. 18 is a flow chart of a method for fabricating a FinFET device in accordance with embodiments of the present disclosure.

FIG. 18 is a flowchart of a method 900 for fabricating a FinFET device in accordance with various aspects of the present disclosure. The method 900 includes a step 910 of etching a semiconductor layer into a plurality of fin structures.

The method 900 includes a step 920 of enlarging the fin structures laterally by performing an amorphous-silicon epitaxial process to the fin structures.

The method 900 includes a step 930 of performing a first nitridation process to side surfaces of the fin structures, the first nitridation process forming an oxynitride layer at the side surfaces of the fin structures.

The method 900 includes a step 940 of forming a liner oxide layer on the oxynitride layer.

The method 900 includes a step 950 of performing a second nitridation process to the liner oxide layer.

The method 900 includes a step 960 of forming an isolation structure around the fin structures.

The method 900 includes a step 970 of removing a portion of the isolation structure, thereby exposing a second segment of each of the fin structures while a first segment of each of the fin structures remains embedded in a remaining portion of the isolation structure.

The method 900 includes a step 980 of forming a gate structure that wraps around each of the fin structures. In some embodiments, the gate structure includes a high-k metal gate. In some embodiments, the step 980 of forming the gate structure comprises forming a dummy gate dielectric and a dummy gate electrode, and replacing the dummy gate dielectric and the dummy gate electrode with a high-k gate dielectric and a metal gate electrode.

It is understood that additional process steps may be performed before, during, or after the steps 910-980 discussed above to complete the fabrication of the semiconductor device. For example, dicing, packaging, and testing processes may be performed. Other process steps are not discussed herein for reasons of simplicity.

Based on the above discussions, it can be seen that the present disclosure offers advantages over conventional FinFET and the fabrication thereof. It is understood, however, that other embodiments may offer additional advantages, and not all advantages are necessarily disclosed herein, and that no particular advantage is required for all embodiments. One advantage is that the FinFET devices of the present disclosure can achieve a small fin pitch size while also maintaining a sufficiently wide fin width. This may be done by conformally growing an amorphous silicon material on the sidewalls of the fin structures, which effectively widens the fin width. The fins with a wider width are less likely to bend or collapse, and they are also less likely to suffer from carrier mobility degradation problems. Consequently, device yield increases, and device performance improves. In addition, by performing one or more additional nitridation processes (not performed in conventional FinFET fabrication) to the FinFET device, the present disclosure increases the nitrogen content in the dielectric layers surrounding the semiconductor fin structures. The increased nitrogen content is beneficial as the nitrogen may react with oxygen in later processes that are rich in oxygen, which would have undesirably consumed at least a part of the semiconductor fin structures. Thus, the nitridation processes of the present disclosure help ensure that the fin structures maintain their integrity and purity. Other advantages include compatibility with existing processing steps and the ease of implementation. Therefore, implementing the present disclosure does not lead to increased costs.

One aspect of the present disclosure involves a semiconductor device. The semiconductor device includes a first FinFET device and a second FinFET device. The first FinFET device includes a first gate, a first source, and a first drain. The first FinFET device has a first source/drain proximity. The second FinFET device includes a second gate, a second source, and a second drain. The second FinFET device has a second source/drain proximity that is different from the first source/drain proximity.

Another aspect of the present disclosure involves a semiconductor device. The semiconductor device includes a semiconductor layer having a fin structure that protrudes out of the semiconductor layer. The fin structure includes a first segment and a second segment disposed over the first segment. The semiconductor device includes a dielectric layer disposed over the semiconductor layer. The first segment of the fin structure is surrounded by the dielectric layer. The semiconductor device includes a metal layer disposed over the dielectric layer. The second segment of the fin structure is surrounded by the metal layer, wherein a nitrogen content of the dielectric layer is greater than a nitrogen content of the metal layer.

Another aspect of the present disclosure involves a method of fabricating a semiconductor device. A semiconductor layer is etched into a plurality of fin structures. A first nitridation process is performed to side surfaces of the fin structures. The first nitridation process forming an oxynitride layer at the side surfaces of the fin structures. A liner oxide layer is formed on the oxynitride layer. An isolation structure is formed around the fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    etching a semiconductor layer into a plurality of fin structures;
    enlarging the fin structures laterally by performing an amorphous-silicon epitaxial process to the fin structures;
    performing a first nitridation process to side surfaces of the fin structures, the first nitridation process forming a first oxynitride layer at the side surfaces of the fin structures;
    forming a liner oxide layer on the first oxynitride layer; and
    forming an isolation structure around the fin structures after the forming of the liner oxide layer.

2. The method of claim 1, further comprising: before the forming of the isolation structure but after the forming of the liner oxide layer, performing a second nitridation process to the liner oxide layer, wherein the second nitridation process converts the liner oxide layer into a second oxynitride layer.

3. The method of claim 2, wherein:
    the forming of the isolation structure comprises exposing the semiconductor device to oxygen; and
    the first oxynitride layer or the second oxynitride layer protects the fin structure from being oxidized by the oxygen introduced by the forming of the isolation structure.

4. The method of claim 3, wherein the isolation structure is formed using a flow-able chemical vapor deposition (FCVD) process that introduces the oxygen to the semiconductor device.

5. The method of claim 1, further comprising:
    removing a portion of the isolation structure, thereby exposing a second segment of each of the fin structures while a first segment of each of the fin structures remains embedded in a remaining portion of the isolation structure; and
    forming a gate structure that wraps around each of the fin structures.

6. The method of claim 5, wherein the gate structure includes a high-k metal gate, and wherein the forming of the gate structure comprises forming a dummy gate dielectric and a dummy gate electrode, and replacing the dummy gate dielectric and the dummy gate electrode with a high-k gate dielectric and a metal gate electrode.

7. A method of fabricating a semiconductor device, comprising:
    forming a fin structure that protrudes vertically upward from a semiconductor layer;
    widening a lateral dimension of the fin structure by conformally growing a layer on the fin structure;
    forming an isolation structure around the fin structure after the widening;
    removing a portion of the isolation structure to expose a segment of the fin structure;
    forming a dummy gate structure that partially wraps around the segment of the fin structure;
    forming source/drain components of the semiconductor device on opposite sides of the dummy gate structure; and
    replacing the dummy gate structure with a functional gate structure after the forming of the source/drain component.

8. The method of claim 7, wherein the fin structure is formed to have an initial lateral dimension in a range from about 6 nanometers (nm) to about 9 nm.

9. The method of claim 7, wherein the conformally growing comprises growing an amorphous silicon layer as the layer on the fin structure.

10. The method of claim 9, wherein the amorphous silicon layer is grown using an epitaxial growth process.

11. The method of claim 10, further comprising: tuning one or more process parameters of the epitaxial growth process to configure a thickness of the amorphous silicon layer.

12. The method of claim 7, further comprising: forming a first nitrogen-containing layer over the layer conformally grown on the fin structure.

13. The method of claim 12, wherein the first nitrogen-containing layer is formed by converting a native oxide of the fin structure into a first oxynitride material via a first nitridation process.

14. The method of claim 13, further comprising: forming a second nitrogen-containing layer over the first nitrogen-containing layer.

15. The method of claim 14, wherein the second nitrogen-containing layer is formed by depositing a liner oxide layer over the first nitrogen-containing layer and converting the liner oxide layer into a second oxynitride material via a second nitridation process.

16. A method of fabricating a semiconductor device, comprising:
    etching a semiconductor layer into a plurality of fin structures;
    enlarging the fin structure laterally by performing an amorphous-silicon epitaxial process to the fin structures;
    performing a first nitridation process to side surfaces of the fin structures, the first nitridation process forming an oxynitride layer at the side surfaces of the fin structures;
    forming a liner oxide layer on the oxynitride layer;
    performing a second nitridation process to the liner oxide layer;
    forming an isolation structure around the fin structures;
    removing a portion of the isolation structure, thereby exposing a second segment of each of the fin structures while a first segment of each of the fin structures remains embedded in a remaining portion of the isolation structure; and forming a gate structure that wraps around each of the fin structures.

17. The method of claim 16, wherein the amorphous-silicon epitaxial process conformally grows an amorphous silicon layer on each of the fin structures.

18. The method of claim 16, wherein the second nitridation process converts the liner oxide layer into a further oxynitride layer.

19. The method of claim 16, wherein the isolation structure is formed after the second nitridation process is performed.

20. The method of claim 1, wherein the amorphous-silicon epitaxial process is performed using a process temperature in a range from 450 degrees Celsius to 600 degrees Celsius and a process time in a range from 100 seconds to 300 seconds.

* * * * *